US009858056B1

(12) United States Patent
Atasu et al.

(10) Patent No.: US 9,858,056 B1
(45) Date of Patent: Jan. 2, 2018

(54) ACCELERATED CONTENT ANALYTICS BASED ON A HIERARCHICAL DATA-FLOW-GRAPH REPRESENTATION

(71) Applicant: International Business Machines Corporation, Armonk, NY (US)

(72) Inventors: Kubilay Atasu, Horgen (CH); Akihiro Nakayama, Kanagawa (JP); Raphael Polig, Dietikon (CH); Tong Xu, Ontario (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/212,547

(22) Filed: Jul. 18, 2016

(51) Int. Cl.
*G06F 9/45* (2006.01)

(52) U.S. Cl.
CPC .......... *G06F 8/4441* (2013.01); *G06F 8/433* (2013.01)

(58) Field of Classification Search
CPC ........................................ G06F 9/45
USPC ................................. 717/154–160
See application file for complete search history.

(56) References Cited

U.S. PATENT DOCUMENTS

| 7,139,752 | B2 | 11/2006 | Broder et al. | |
|---|---|---|---|---|
| 8,782,628 | B2 * | 7/2014 | Andrade | G06F 8/433 |
| | | | | 717/156 |
| 8,799,286 | B2 | 8/2014 | Cooper et al. | |
| 2012/0330638 | A1 * | 12/2012 | Pell | G06F 17/505 |
| | | | | 703/21 |
| 2017/0083332 | A1 * | 3/2017 | Danielsson | G06T 1/20 |

OTHER PUBLICATIONS

UIMA ("UIMA Tools Guide and Reference"), Nov. 2011.*
Zhu et al., "IBM Watson Content Analytics Discovering Actionable Insight from Your Content", ibm.com Redbooks, https://www.redbooks.ibm.com/redbooks/pdfs/sg247877.pdf, Jul. 2014, 598 pages.

* cited by examiner

*Primary Examiner* — Jae Jeon
(74) *Attorney, Agent, or Firm* — Scully, Scott, Murphy & Presser, P.C.; Daniel P. Morris, Esq.

(57) ABSTRACT

A system and method to hardware-accelerate finite state transducer libraries and their compilation toolchains. In an embodiment, a computer-implemented method for partitioning an UIMA-PEAR file into software-based and hardware-accelerated components may comprise creating a data-flow graph representation of the UIMA-PEAR-file, flattening hierarchies of the data-flow graph representation, and selecting the components to be hardware accelerated from the flattened hierarchies of the data-flow graph representation based on data dependencies of data types produced and consumed by each component of the flattened data-flow graph.

15 Claims, 8 Drawing Sheets

ACCELERATED CONTENT ANALYTICS BASED ON A HIERARCHICAL DATA-FLOW-GRAPH REPRESENTATION

BACKGROUND

The present disclosure relates to techniques for hardware accelerating finite state transducer libraries and their compilation toolchains.

The process of extracting information from large-scale unstructured text is called text analytics and has applications in business analytics, healthcare, and security intelligence. Analyzing unstructured text and extracting insights hidden in it at high bandwidth and low latency are computationally challenging tasks. In particular, text analytics functions typically rely heavily on finite-state-machine processing-based tasks. Typically, these finite-state-machine-processing based tasks dominate the runtime of text analytics systems. conventionally, such tasks do not map well on general-purpose processors. However, Field Programmable Gate Arrays (FPGAs) may be an advantageous medium for executing such tasks because of the massive parallelism they offer, which can be exploited at bit-level granularity.

Typically, much of the execution time of text analytics runtime systems is spent on shallow parser stages of document processors, which may be built software-based finite state transducer libraries. Accordingly, a need arises for techniques by which the execution time of finite state transducer libraries may be reduced, to provide improved performance and reduced cost.

SUMMARY

Embodiments of the present disclosure may provide the capability to hardware-accelerate finite state transducer libraries and their compilation toolchains, which may provide improved price per performance when running text analytics. Embodiments of the present invention may provide, for example, an Unstructured Information Management Architecture (UIMA) pipeline, which may be exported in the form of a Processing Engine ARchive (PEAR) file. A PEAR file is the UIMA standard packaging format for UIMA components. A PEAR package may be used to distribute and reuse components within UIMA applications.

In an embodiment of the present disclosure, a computer-implemented method for partitioning an UIMA-PEAR file into software-based and hardware-accelerated components may comprise creating a data-flow graph representation of the UIMA-PEAR-file, flattening hierarchies of the data-flow graph representation, and selecting the components to be hardware accelerated from the flattened hierarchies of the data-flow graph representation based on data dependencies of data types produced and consumed by each component of the flattened data-flow graph.

In an embodiment, the data-flow graph representation may comprise plurality of nodes, each node representing a component that either produces data or consumes data and a plurality of edges, each edge representing a data type and connecting a component that produces the data type with a component that consumes the data type. Evaluating software and hardware complexity of each component may comprise determining a software execution time spent on each component and determining resources needed to implement each component. The method may further comprise mapping software-based components into resources of a hardware accelerator. The method may further comprise mapping multiple software-based components into resources of a hardware accelerator to form a data-flow pipeline. Selecting the components to be hardware accelerated may comprise removing components from analysis engines, removing analysis engines that have no more components, merging remaining analysis engines to form new components, wherein at least some of the merged analysis engines are from different levels of hierarchy of the data-flow graph representation of the UIMA-PEAR-file, and adding the new components to be implemented in hardware.

In an embodiment of the present disclosure, a computer program product for partitioning an UIMA-PEAR file into software-based and hardware-accelerated components may comprise a non-transitory computer readable storage having program instructions embodied therewith, the program instructions executable by a computer, to cause the computer to perform a method comprising creating a data-flow graph representation of the UIMA-PEAR-file, flattening hierarchies of the data-flow graph representation, and selecting the components to be hardware accelerated from the flattened hierarchies of the data-flow graph representation based on data dependencies of data types produced and consumed by each component of the flattened data-flow graph.

In an embodiment of the present disclosure, a system for partitioning an UIMA-PEAR file into software-based and hardware-accelerated components may comprise a processor, memory accessible by the processor, and computer program instructions stored in the memory and executable by the processor to perform creating a data-flow graph representation of the UIMA-PEAR-file, flattening hierarchies of the data-flow graph representation, and selecting the components to be hardware accelerated from the flattened hierarchies of the data-flow graph representation based on data dependencies of data types produced and consumed by each component of the flattened data-flow graph.

BRIEF DESCRIPTION OF THE DRAWINGS

The details of the present invention, both as to its structure and operation, can best be understood by referring to the accompanying drawings, in which like reference numbers and designations refer to like elements.

DETAILED DESCRIPTION

Embodiments of the present disclosure may provide the capability to hardware-accelerate finite state transducer libraries and their compilation toolchains, which may provide improved price per performance when running text analytics.

Embodiments of the present disclosure may provide, for example, an Unstructured Information Management Architecture (UIMA) pipeline, which may be exported in the form of a Processing Engine ARchive (PEAR) file. A PEAR file is the UIMA standard packaging format for UIMA components. A PEAR package may be used to distribute and reuse components within UIMA applications. The UIMA framework may also provide APIs and methods to automatically deploy and verify PEAR packages. A PEAR package is typically built in a hierarchical fashion, wherein the highest level of hierarchy may be composed of analysis engines. Each analysis engine, in turn, may be a composition of a set of library-based or user-defined components.

Typically, much of the execution time of the a text analytics runtime system may be spent on shallow parser stages of the document processors, which may, for example, be built on the JAVA-based finite state transducer library (JFST). Embodiments of the present disclosure may provide, for example, methods that enable offloading performance critical parts of Apache UIMA based document processors, such as those based on the JFST library, to more efficient computing fabrics, such as FPGAs, without modifying the underlying runtime system.

Figure 1:
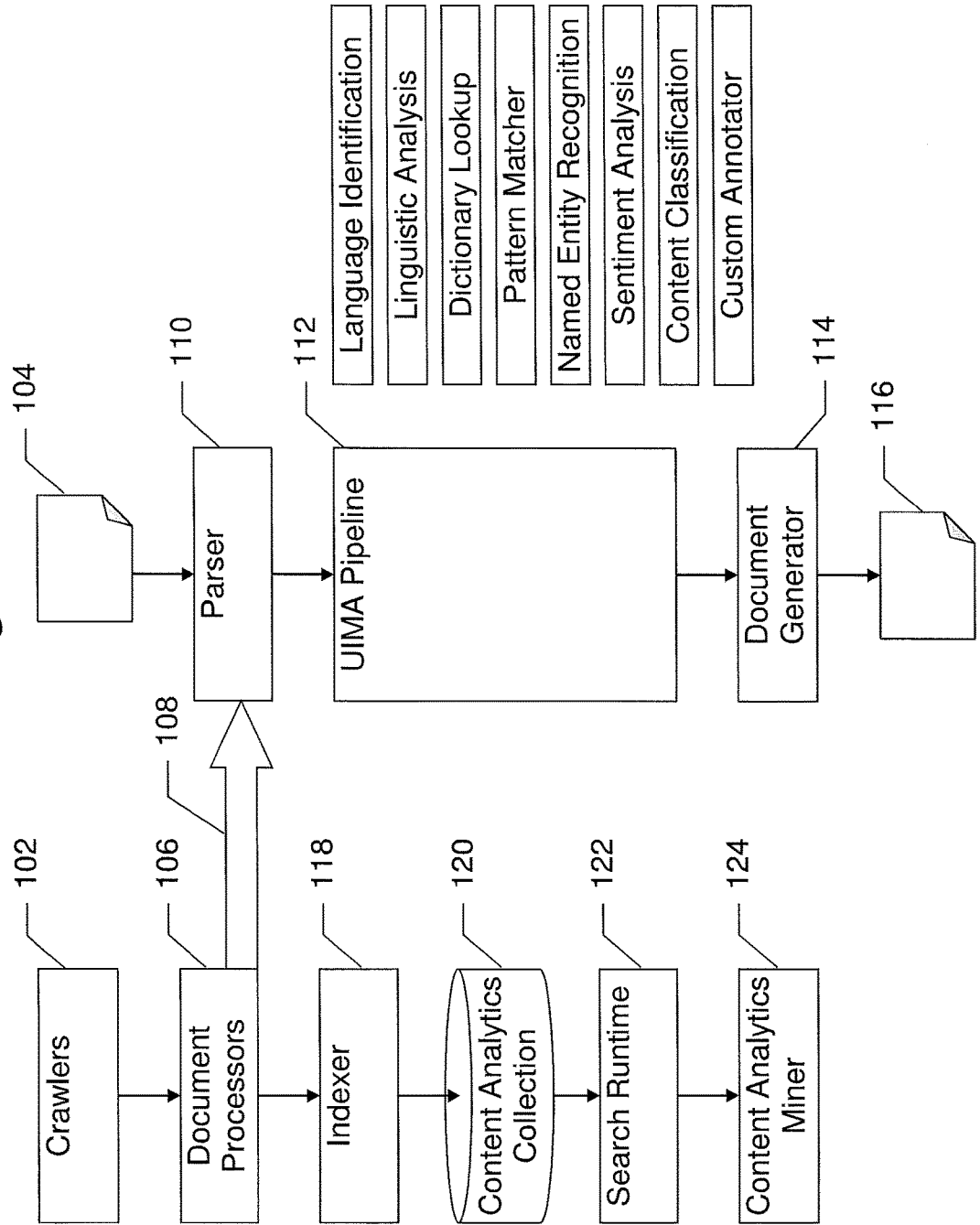
FIG. 1 is an exemplary data flow diagram of data flow defined within a UIMA PEAR file.

An exemplary data flow diagram of data flow defined within a UIMA PEAR file is shown in FIG. 1. In this example, one or more documents may be obtained by one or more crawlers 102, which systematically browse (crawl) the World Wide Web to obtain documents to be processed. Each document so obtained, such as crawled document 104, may be input to one or more document processors 106. The processing 108 performed by document processors 106 may begin with crawled document 104 being received. Crawled document 104 may be input to parser 110, which may perform syntactic analysis of the text and/or other symbols included in the document. The output information from parser 110 may be input to UIMA Pipeline 112, which may perform a variety of analytic processes, including, for example, Language Identification, Linguistic Analysis, Dictionary Lookup, Pattern Matching, Named Entity Recognition, Sentiment Analysis, Content Classification, and Custom Annotation. The results of the analytic processes may be combined in document generator 114 to form an output document 116. Typically, output document 116 may be in the Apache Lucene format. Output document 116 may then be input to the remaining processing blocks, such as Indexer 118, Content Analytics Collection 120, Runtime Search 122, and Content Analytics Miner 124, for further processing.

Figure 2:
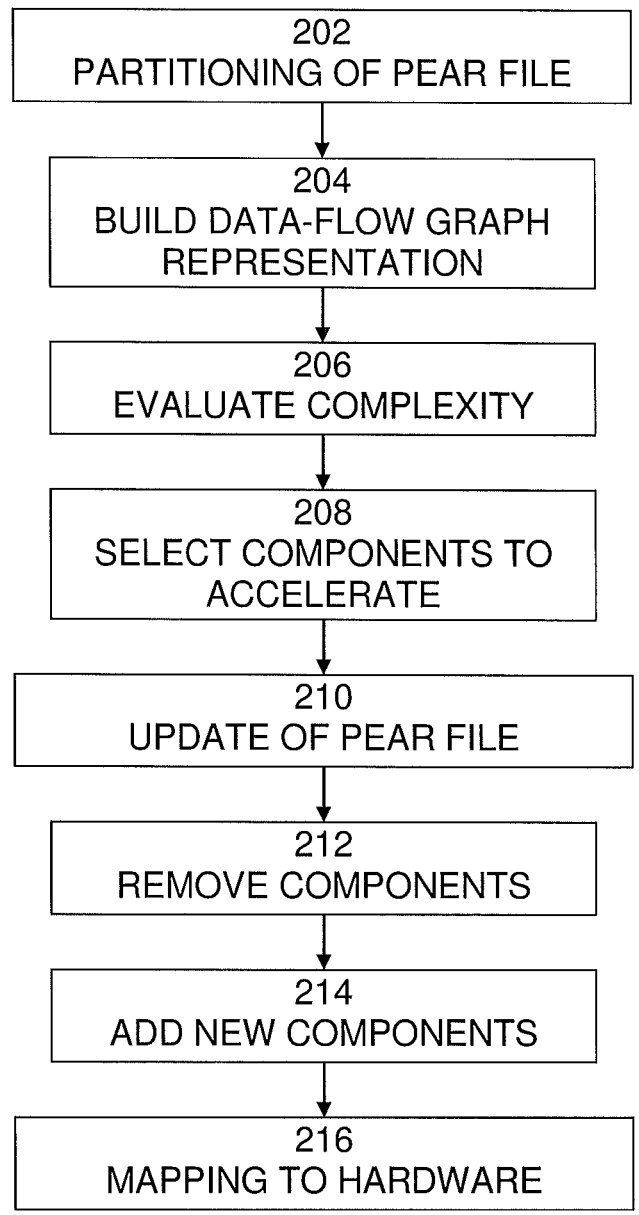
FIG. 2 is an exemplary flow diagram of a process for accelerating UIMA-based content analytics functions.
Figure 3:
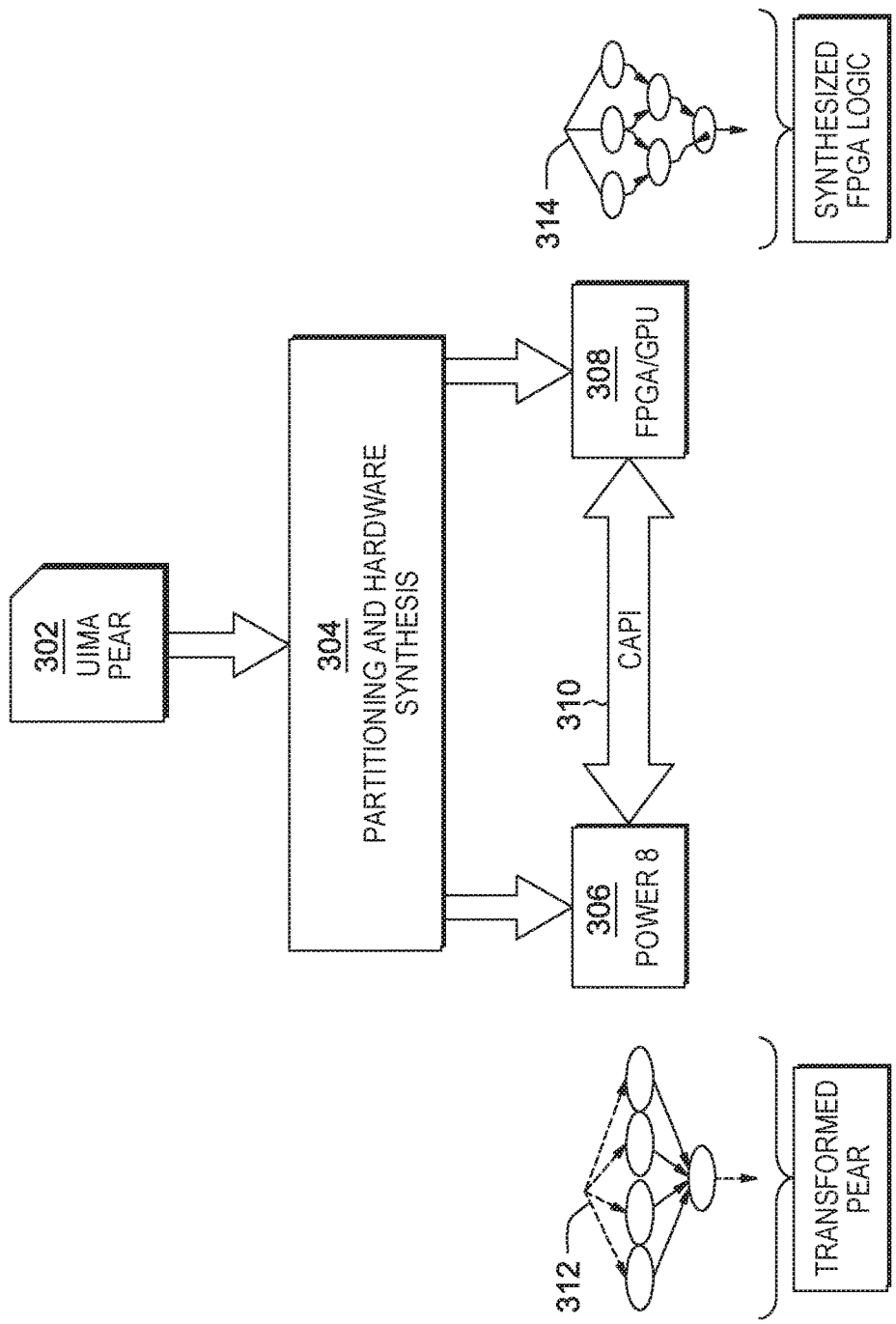
FIG. 3 is an exemplary data flow diagram of an environment in which embodiments of the present disclosure may be implemented.

An exemplary flow diagram of a process 200 for accelerating UIMA-based content analytics functions is shown in FIG. 2. It is best viewed in conjunction with FIG. 3, which is an exemplary data flow diagram of an environment in which process 200 may be implemented. Process 200 begins with 202, in which a PEAR file 302 may be partitioned 304 into software-based and hardware-accelerated components. For example, the software-based components may be executed on a general purpose CPU, such as a POWER processor 306, while the hardware-accelerated components may be run on a more efficient execution fabric, such as an FPGA or a GPU 308. The communication between the software-based and accelerated components may occur through a high-speed bus interface, such as the Coherent Accelerator Processor Interface 310 (CAPI) of POWER processors.

Figure 4:
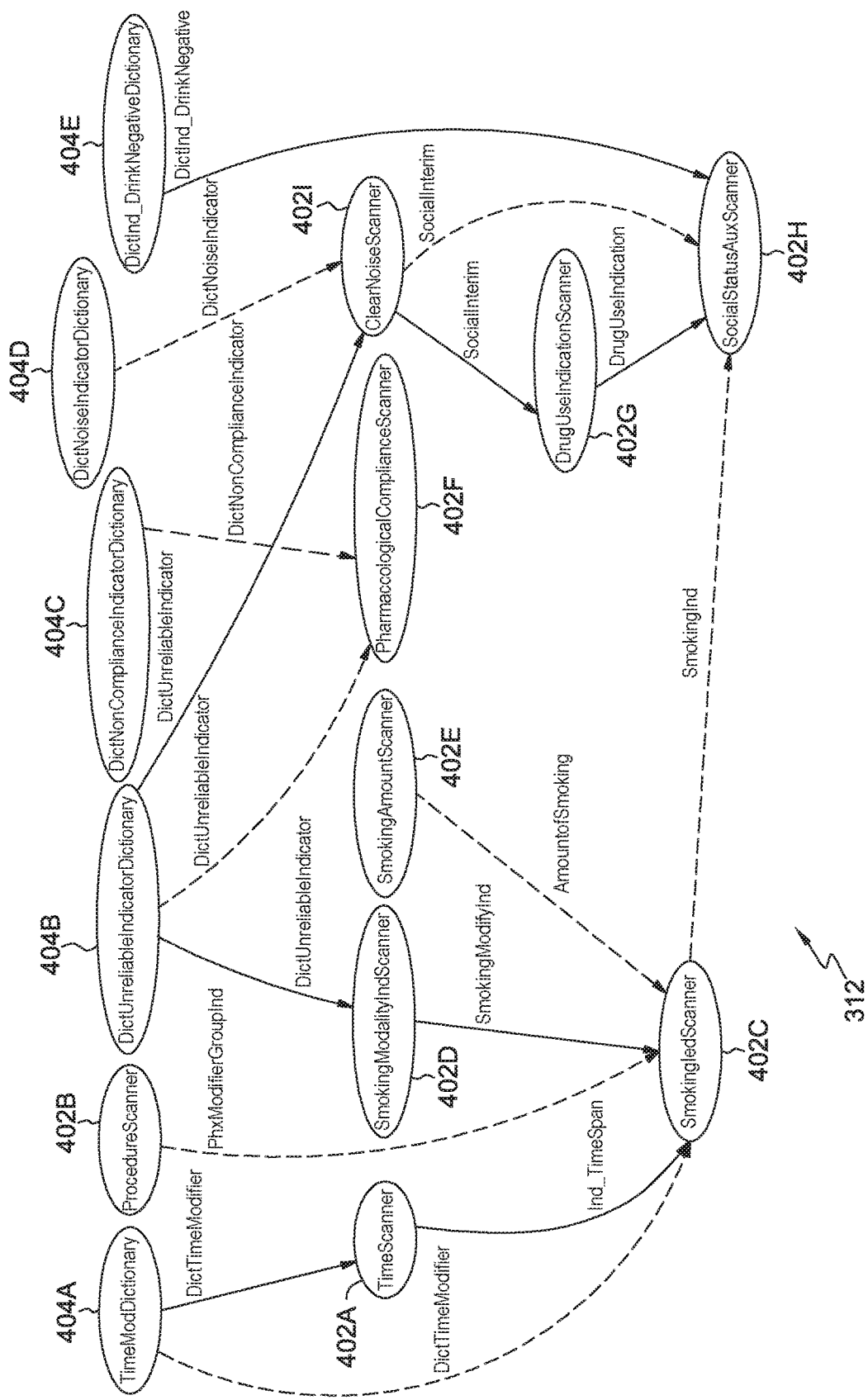
FIG. 4 illustrates an example of a data-flow graph representation of a PEAR file.

Partitioning may involve a number of processes. For example, at 204 a data-flow graph representation 312 may be built. A data-flow graph representation 312, for example, as shown in FIG. 4, may show all the components that are part of a given PEAR file and the way information is communicated across these components. The data flow graph may be constructed by flattening the hierarchies and performing a data-dependency analysis based on the data types produced and consumed by each component of the flattened data-flow graph. Formally, if type t is produced by component x and consumed by component y, an edge, labeled t, is added between the node representing component x and the node representing component y in the flattened data-flow graph.

At 206, the software and hardware complexity of each component of the PEAR file may be evaluated. The software complexity may be evaluated by profiling the PEAR file using a representative data set. In this way, the percentage of software execution time spent on each component may be obtained. The hardware complexity may be evaluated by estimating the needed amounts of resources, such as the number of registers, the number of logic gates, the amount of on-chip and off-chip memory resources, the amount of interconnect resources, such as crossbars, the achievable clock frequency, and the number of clock cycles needed to complete the hardware execution of the component using a representative data set. These estimations may be made based on a high-level analysis of the components or by mapping each component to the hardware substrate using a compilation tool chain. Profiling of the software components may also reveal the communication cost associated with the edges of the data flow graph.

At 208, the components to be hardware accelerated may be selected. Such a selection may be made based on the factors such as the software and hardware complexity of the components, the resources that are available on the hardware accelerator, and the additional communication cost induced by moving components from software to hardware. The goal may be to maximize the speed-up with respect to the original software-only solution without exceeding the capacity constraints of the hardware acceleration platform, such as the number of look-up tables (LUTs), registers, block random-access memories (BRAMs), and routing resources of an FPGA.

An exemplary partitioning of a data-flow graph is shown in FIG. 4. In this example, the shallow parser components 402A-I may be implemented by the software libraries, such as JFST, and the lexical analysis functions 404A-E may be implemented by other software libraries. If a profiling analysis of the software reveals that the lexical analysis functions take a small fraction of the execution time, and most of the execution time is spent on the shallow parsers, it may be advantageous to offload all shallow parser components to hardware. However, if it is not possible to offload all shallow parser components to hardware, for example, due to limitations on the amount of resources that can be used on the hardware accelerator, the partitioning phase may decide to offload only a selected set of components to hardware and keep the rest in software.

Figure 5:
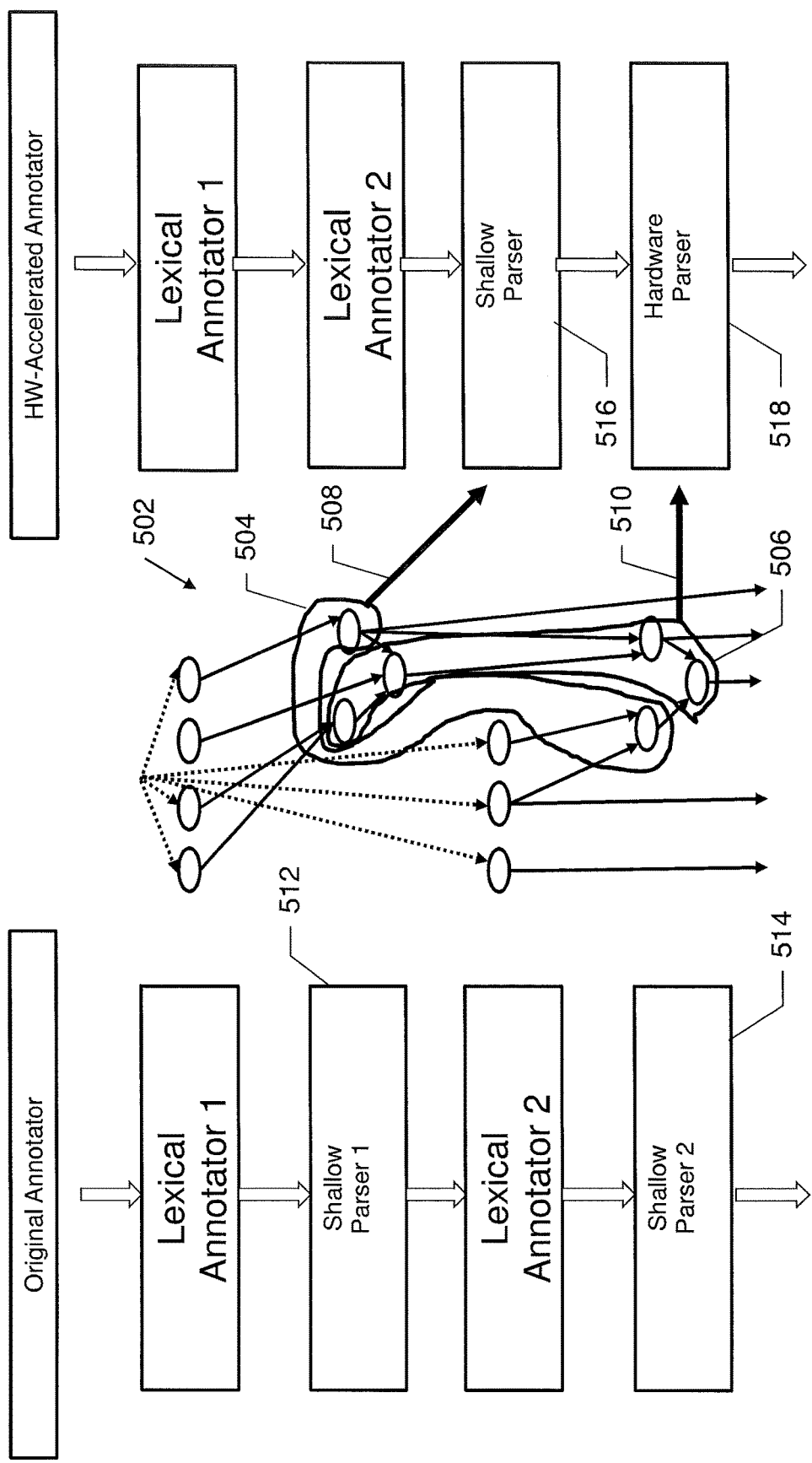
FIG. 5 is an exemplary flow diagram of a PEAR file update process.

Returning to FIG. 2, once the individual components of the analysis engines are assigned to either hardware or software, then at 210, the PEAR file may be updated to reflect the partitioning. Typically, the update may include preserving the software-based components that have not been modified, at 212, removing the components software-based components that have been modified/offloaded, and, at 214, adding new hardware-based components to implement the hardware-offload. An example of the update process is shown in FIG. 5. For example, at 212, the components may be removed 502 from the analysis engines (AEs) that contain them. If an AE is left with no more components, it may be removed entirely from the top-level pipeline. The AEs that are modified, but still contain some components, may be merged into new AEs 504, 506, if indicated by the partitioning. This results in a modification of the top-level pipeline by, at 214, creating new AEs 504, 506, which may be inserted at the correct positions of the pipeline so that the data dependencies may be preserved. Components that are assigned to a hardware component may be executed by one or more AEs that communicate data with the accelerator hardware, such as the FPGA or GPU. Typically, components from more than one shallow parser may be combined to form new parsers. For example, components from shallow parsers 512, 514 may be combined 508 to form a new shallow parser 516 and may be combined 510 to form a new hardware-based parser 518. In order to do this, the hierarchies of the data flow graph of the shallow parsers 512, 514 may be flattened and a data-dependency analysis based on the data types produced and consumed by each component of the flattened data-flow graph may be performed. The components in the flattened hierarchies may be grouped to form the new parsers 516, 518 based on the determined data-dependencies.

Figure 6:
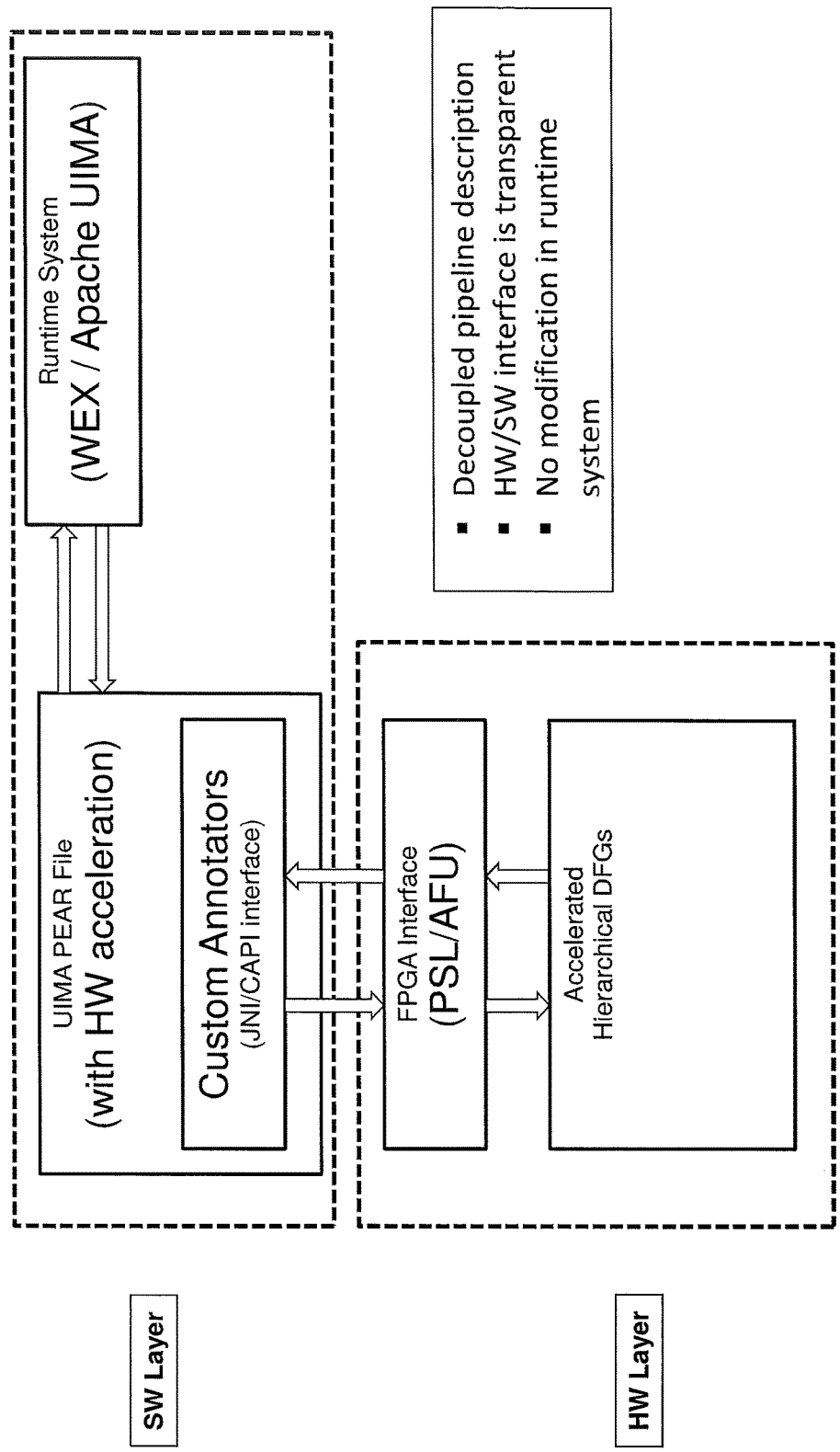
FIG. 6 illustrates an example of an updated PEAR file.

The hardware accelerator analysis engines may be configured properly to only communicate the necessary data elements at their stage in the processing pipeline. As the UIMA framework may be implemented in Java, this communication first involves a generic mechanism for transferring dynamic data structures from Java to native code via the Java Native Interface (JNI). Once the data is located in native memory space, it can be transferred 508, 510 to and from the accelerator using, for example, the CAPI interface 310, shown in FIG. 3, to an FPGA. The necessary changes may be performed inside the PEAR file, as shown in FIG. 6. Accordingly, the interfacing hardware and software based components may not require changes in the implementation of the software runtime system.

Returning to FIG. 2, at 216, mapping of the hardware-accelerated components to a hardware-acceleration substrate, such as an FPGA, may be performed using, for example, a compilation tool chain. Such a compilation tool chain may map the software-based components into the resources of the hardware accelerator. When multiple components are offloaded to hardware, the compiler may effectively create a data flow pipeline in hardware. Typically, the offloaded components may be laid out in space using the hardware resources of the accelerator and may communicate with each other through the dedicated data transfer channels of the accelerator. Likewise, the offloaded components may execute without requiring software intervention.

Figure 7:
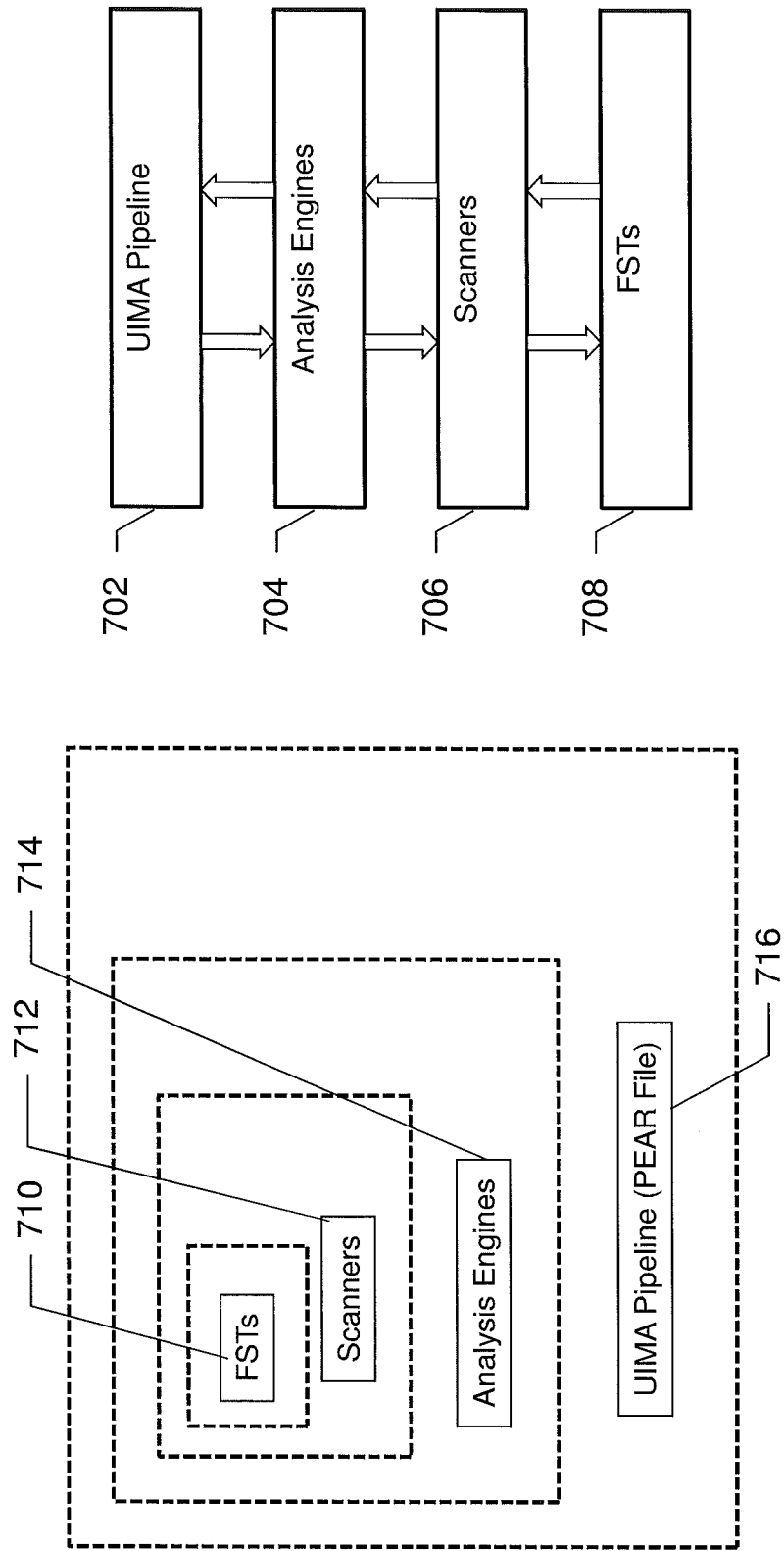
FIG. 7 illustrates hierarchical definition of components of a UIMA pipeline.

As shown in FIG. 7, the components of a UIMA pipeline may be defined hierarchically. A UIMA pipeline 702 may typically be composed of multiple interacting analysis engines 704. Some of the analysis engines 702 may be composed of lexical analysis functions, such as part-of-speech tagging, dictionary matching, and white-space tokenization. Others may implement shallow or deep parsing functions. Shallow parsers may typically be built on top of the JFST technology in WEX Content Analytics Studio, where each parser may be composed of several interacting scanners 706, and scanner may be composed of several interacting finite state transducers (FSTs) 708.

Typically, a compiler may first create a mapping of each finite state transducer 710 to the hardware resources of the accelerator, and then instantiate communication channels between the individual FSTs on the accelerator hardware to form the scanners 712, and then instantiates communication channels between the individual scanners to form a combined hardware-accelerated data flow pipeline for a given analysis engine 714.

Figure 8:
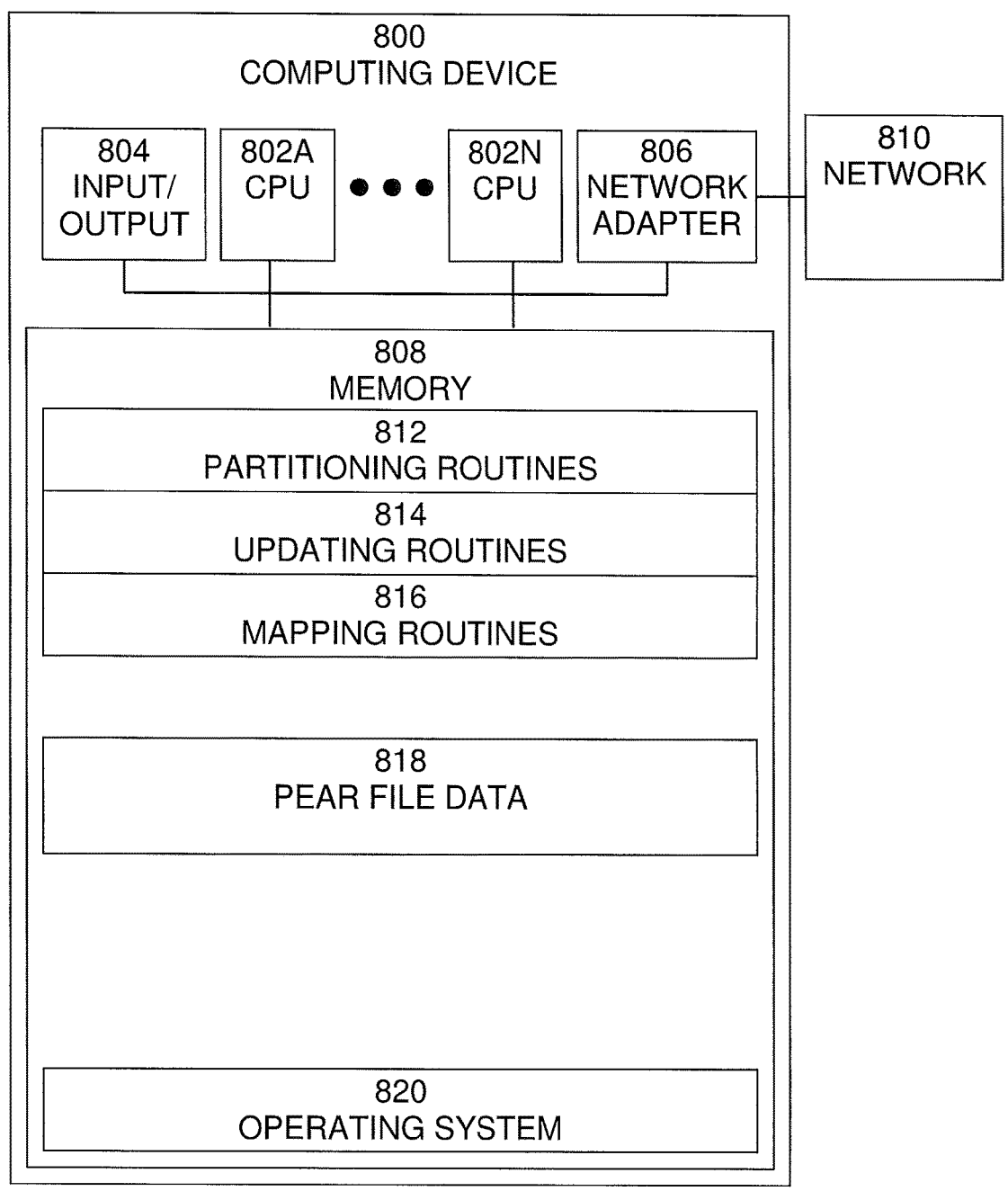
FIG. 8 is an exemplary block diagram of a computer system in which processes involved in the embodiments described herein may be implemented.

An exemplary block diagram of a computing device 800, in which processes involved in the embodiments described herein may be implemented, is shown in FIG. 8. Computing device 800 is typically a programmed general-purpose computer system, such as an embedded processor, system on a chip, personal computer, workstation, server system, and minicomputer or mainframe computer. Likewise, computing device 800 may be implemented in a wrist-worn, or other personal or mobile device, and may include sensor circuitry as well as display circuitry to display object identification information. Computing device 800 may include one or more processors (CPUs) 802A-802N, input/output circuitry 804, network adapter 806, and memory 808. CPUs 802A-802N execute program instructions in order to carry out the functions of the present invention. Typically, CPUs 802A-802N are one or more microprocessors, such as an INTEL PENTIUM® processor. FIG. 8 illustrates an embodiment in which computing device 800 is implemented as a single multi-processor computer system, in which multiple processors 802A-802N share system resources, such as memory 808, input/output circuitry 804, and network adapter 806. However, the present invention also contemplates embodiments in which computing device 800 is implemented as a plurality of networked computer systems, which may be single-processor computer systems, multi-processor computer systems, or a mix thereof.

Input/output circuitry 804 provides the capability to input data to, or output data from, computing device 800. For example, input/output circuitry may include input devices, such as keyboards, mice, touchpads, trackballs, scanners, analog to digital converters, etc., output devices, such as video adapters, monitors, printers, etc., and input/output devices, such as, modems, etc. Network adapter 806 interfaces device 800 with a network 810. Network 810 may be any public or proprietary LAN or WAN, including, but not limited to the Internet.

Memory 808 stores program instructions that are executed by, and data that are used and processed by, CPU 802 to perform the functions of computing device 800. Memory 808 may include, for example, electronic memory devices, such as random-access memory (RAM), read-only memory (ROM), programmable read-only memory (PROM), electrically erasable programmable read-only memory (EEPROM), flash memory, etc., and electro-mechanical memory, such as magnetic disk drives, tape drives, optical disk drives, etc., which may use an integrated drive electronics (IDE) interface, or a variation or enhancement thereof, such as enhanced IDE (EIDE) or ultra-direct memory access (UDMA), or a small computer system interface (SCSI) based interface, or a variation or enhancement thereof, such as fast-SCSI, wide-SCSI, fast and wide-SCSI, etc., or Serial Advanced Technology Attachment (SATA), or a variation or enhancement thereof, or a fiber channel-arbitrated loop (FC-AL) interface.

The contents of memory 808 may vary depending upon the function that computing device 800 is programmed to perform. In the example shown in FIG. 8, exemplary memory contents are shown representing routines and data for embodiments of the processes described above. However, one of skill in the art would recognize that these routines, along with the memory contents related to those routines, may not be included on one system or device, but rather may be distributed among a plurality of systems or devices, based on well-known engineering considerations. The present invention contemplates any and all such arrangements.

In the example shown in FIG. 8, memory 808 may include partitioning routines 812, updating routines 814, mapping routines 816, additional processing routines 808, PEAR file data 820, and operating system 822. For example, partitioning routines 812 may include routines that partition one or more PEAR files in PEAR file data 820 into software-based and hardware-accelerated components. Updating routines 814 may include routines to update the PEAR file to reflect the partitioning. Mapping routines 816 may include routines to map the hardware-accelerated components to a hardware-acceleration substrate, such as an FPGA. Operating system 820 provides overall system functionality.

As shown in FIG. 8, the present invention contemplates implementation on a system or systems that provide multi-processor, multi-tasking, multi-process, and/or multi-thread computing, as well as implementation on systems that provide only single processor, single thread computing. Multi-processor computing involves performing computing using more than one processor. Multi-tasking computing involves performing computing using more than one operating system task. A task is an operating system concept that refers to the combination of a program being executed and bookkeeping information used by the operating system. Whenever a program is executed, the operating system creates a new task for it. The task is like an envelope for the program in that it identifies the program with a task number and attaches other bookkeeping information to it. Many operating systems, including Linux, UNIX®, OS/2®, and Windows®, are capable of running many tasks at the same time and are called multitasking operating systems. Multi-tasking is the ability of an operating system to execute more than one executable at the same time. Each executable is running in its own address space, meaning that the executables have no way to share any of their memory. This has advantages, because it is impossible for any program to damage the execution of any of the other programs running on the system. However, the programs have no way to exchange any information except through the operating system (or by reading files stored on the file system). Multi-process computing is similar to multi-tasking computing, as the terms task and process are often used interchangeably, although some operating systems make a distinction between the two.

The present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device.

The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A computer-implemented method for partitioning an Unstructured Information Management Architecture (UIMA)-Processing Engine ARchive (PEAR) file into software-based and hardware-accelerated components comprising:
    creating a data-flow graph representation of the UIMA-PEAR file;
    evaluating the software and hardware complexity of each component of the data-flow graph representation;
    flattening hierarchies of the data-flow graph representation; and
    selecting the components to be hardware accelerated from the flattened hierarchies of the data-flow graph representation based on data dependencies of data types produced and consumed by each component of the flattened data-flow graph, wherein selecting the components to be hardware accelerated comprises:
        removing off-loadable software components from analysis engines, wherein the highest level of hierarchy of the data-flow graph representation is composed of the analysis engines and wherein each analysis engine is a composition of a set of library-based or user-defined software components;
        removing analysis engines that have no more off-loadable software components:
        merging remaining analysis engines to form new hardware-based components while preserving the data dependencies of the data types, wherein at least some of the merged analysis engines are from different levels of hierarchy of the data-flow graph representation of the UIMA-PEAR file; and
        adding the new hardware-based components to be implemented in hardware.

2. The method of claim 1, wherein the data-flow graph representation comprises:
    a plurality of nodes, each node representing a component that either produces data or consumes data; and
    a plurality of edges, each edge representing a data type and connecting a component that produces the data type with a component that consumes the data type.

3. The method of claim 2, wherein evaluating software and hardware complexity of each component comprises:
    determining a software execution time spent on each component; and
    determining resources needed to implement each component.

4. The method of claim 3, further comprising:
    mapping software-based components into resources of a hardware accelerator.

5. The method of claim 3, further comprising:
    mapping multiple software-based components into resources of a hardware accelerator to form a data-flow pipeline.

6. A computer program product for partitioning an Unstructured information Management Architecture (UIMA)-Processing Engine ARchive (PEAR) file into software-based and hardware-accelerated components, the computer program product comprising a non-transitory computer readable storage having program instructions embodied therewith, the program instructions executable by a computer, to cause the computer to perform a method comprising:
    creating a data-flow graph representation of the UIMA-PEAR-file;
    evaluating the software and hardware complexity of each component of the data-flow graph representation;
    flattening hierarchies of the data-flow graph representation; and
    selecting the components to be hardware accelerated from the flattened hierarchies of the data-flow graph representation based on data dependencies of data types produced and consumed by each component of the flattened data-flow graph, wherein selecting the components to be hardware accelerated comprises:
        removing off-loadable software components from analysis engines, wherein the highest level of hierarchy of the data-flow graph representation is composed of the analysis engines and wherein each analysis engine is a composition of a set of library-based or user-defined software components;
        removing analysis engines that have no more off-loadable software components;
        merging remaining analysis engines to form new hardware-based components while preserving the data dependencies of the data types, wherein at least some of the merged analysis engines are from different levels of hierarchy of the data-flow graph representation of the UIMA-PEAR file; and adding the new hardware-based components to be implemented in hardware.

7. The computer program product of claim 6, wherein the data-flow graph representation comprises:

a plurality of nodes, each node representing a component that either produces data or consumes data; and a plurality of edges, each edge representing a data type and connecting a component that produces the data type with a component that consumes the data type.

8. The computer program product of claim 7, wherein evaluating software and hardware complexity of each component comprises:

determining a software execution time spent on each component; and determining resources needed to implement each component.

9. The computer program product of claim 8, further comprising program instructions for:

mapping software-based components into resources of a hardware accelerator.

10. The computer program product of claim 8, further comprising program instructions for:

mapping multiple software-based components into resources of a hardware accelerator to form a data-flow pipeline.

11. A system for partitioning an Unstructured Information Management Architecture (UIMA)-Processing Engine ARchive (PEAR) file into software-based and hardware-accelerated components, the system comprising a processor, memory accessible by the processor, and computer program instructions stored in the memory and executable by the processor to perform:

creating a data-flow graph representation of the UIMA-PEAR-file;

flattening hierarchies of the data-flow graph representation; and selecting the components to be hardware accelerated from the flattened hierarchies of the data-flow graph representation based on data dependencies of data types produced and consumed by each component of the flattened data-flow graph, wherein selecting the components to be hardware accelerated comprises:

removing off-loadable software components from analysis engines, wherein the highest level of hierarchy of the data-flow graph representation is composed of the analysis engines and wherein each analysis engine is a composition of a set of library-based or user-defined software components;

removing analysis engines that have no more off-loadable software components;

merging remaining analysis engines to form new hardware-based components while preserving the data dependencies of the data types, wherein at least some of the merged analysis engines are from different levels of hierarchy of the data-flow graph representation of the UIMA-PEAR file; and adding the new hardware-based components to be implemented in hardware.

12. The system of claim 11, wherein the data-flow graph representation comprises:

a plurality of nodes, each node representing a component that either produces data or consumes data; and a plurality of edges, each edge representing a data type and connecting a component that produces the data type with a component that consumes the data type.

13. The system of claim 12, wherein evaluating software and hardware complexity of each component comprises:

determining a software execution time spent on each component; and determining resources needed to implement each component.

14. The system of claim 13, further comprising computer program instructions for:

mapping software-based components into resources of a hardware accelerator.

15. The system of claim 13, further comprising computer program instructions for:

mapping multiple software-based components Into resources of a hardware accelerator to form a data-flow pipeline.

* * * * *